United States Patent
Egerter et al.

(10) Patent No.: US 9,003,653 B2
(45) Date of Patent: Apr. 14, 2015

(54) METHOD FOR THE PRODUCTION OF A CERAMIC MULTILAYER CIRCUIT ARRANGEMENT

(75) Inventors: Juergen Egerter, Reutlingen (DE); Walter Roethlingshoefer, Reutlingen (DE); Markus Werner, Deizisau (DE)

(73) Assignee: Robert Bosch GmbH, Stuttgart (DE)

( * ) Notice: Subject to any disclaimer, the term of this patent is extended or adjusted under 35 U.S.C. 154(b) by 969 days.

(21) Appl. No.: 12/594,183

(22) PCT Filed: Feb. 7, 2008

(86) PCT No.: PCT/EP2008/051485
§ 371 (c)(1),
(2), (4) Date: Mar. 18, 2010

(87) PCT Pub. No.: WO2008/119582
PCT Pub. Date: Oct. 9, 2008

(65) Prior Publication Data
US 2010/0187000 A1    Jul. 29, 2010

(30) Foreign Application Priority Data
Mar. 30, 2007  (DE) .......................... 10 2007 015 399

(51) Int. Cl.
*H01K 3/22*    (2006.01)
*H01L 21/48*   (2006.01)
*H05K 3/46*    (2006.01)
*H05K 1/03*    (2006.01)

(52) U.S. Cl.
CPC ........ *H01L 21/4807* (2013.01); *H01L 21/4857* (2013.01); *H05K 3/4667* (2013.01); *H05K 1/0306* (2013.01); *H05K 3/465* (2013.01); *H05K 2201/09881* (2013.01); *H05K 2203/0169* (2013.01); *H05K 2203/1344* (2013.01); *H05K 2203/1366* (2013.01)

(58) Field of Classification Search
CPC .......... H01L 21/4807; H01L 21/4857; H05K 3/4667; H05K 1/0306; H05K 3/465; H05K 2203/1366; H05K 2201/09881; H05K 2203/0169; H05K 2203/1344
USPC ........ 29/592.1, 830, 831, 846, 848, 849, 851; 156/89.12, 578, 580; 174/258; 419/7, 419/35
See application file for complete search history.

(56) References Cited

U.S. PATENT DOCUMENTS

| 6,085,413 | A | 7/2000 | Klassen et al. |
| 6,868,885 | B2 * | 3/2005 | Kakimoto et al. ............ 156/578 |
| 7,378,052 | B2 * | 5/2008 | Harryson .......................... 419/7 |

FOREIGN PATENT DOCUMENTS

| DE | 19615787 A1 | 10/1997 |
| DE | 19817359 A1 | 4/1998 |
| DE | 19638195 A1 | 10/1999 |

(Continued)

*Primary Examiner* — Donghai D Nguyen
(74) *Attorney, Agent, or Firm* — Kenyon & Kenyon LLP

(57) ABSTRACT

A method for producing a ceramic multilayer circuit system, and a corresponding multilayer circuit system are provided. An embodiment of the method includes sequential deposition of a plurality of circuit layers of the multilayer circuit system on a substrate using a powder spray method; pressing of the deposited plurality of circuit layers; and thermal sintering of the pressed plurality of circuit layers. The individual circuit layers have electrically conductive areas made of at least one conductive material and electrically insulating areas made of at least one ceramic material.

16 Claims, 6 Drawing Sheets

(56) References Cited

FOREIGN PATENT DOCUMENTS

| EP | 0 329 973 A | 8/1989 |
| JP | 4-188503 | 7/1992 |
| JP | 09-232.174 | * 9/1997 |
| JP | 2001-79819 | 3/2001 |
| JP | 2004-342831 | 12/2004 |
| JP | 2005-5645 | 1/2005 |

* cited by examiner

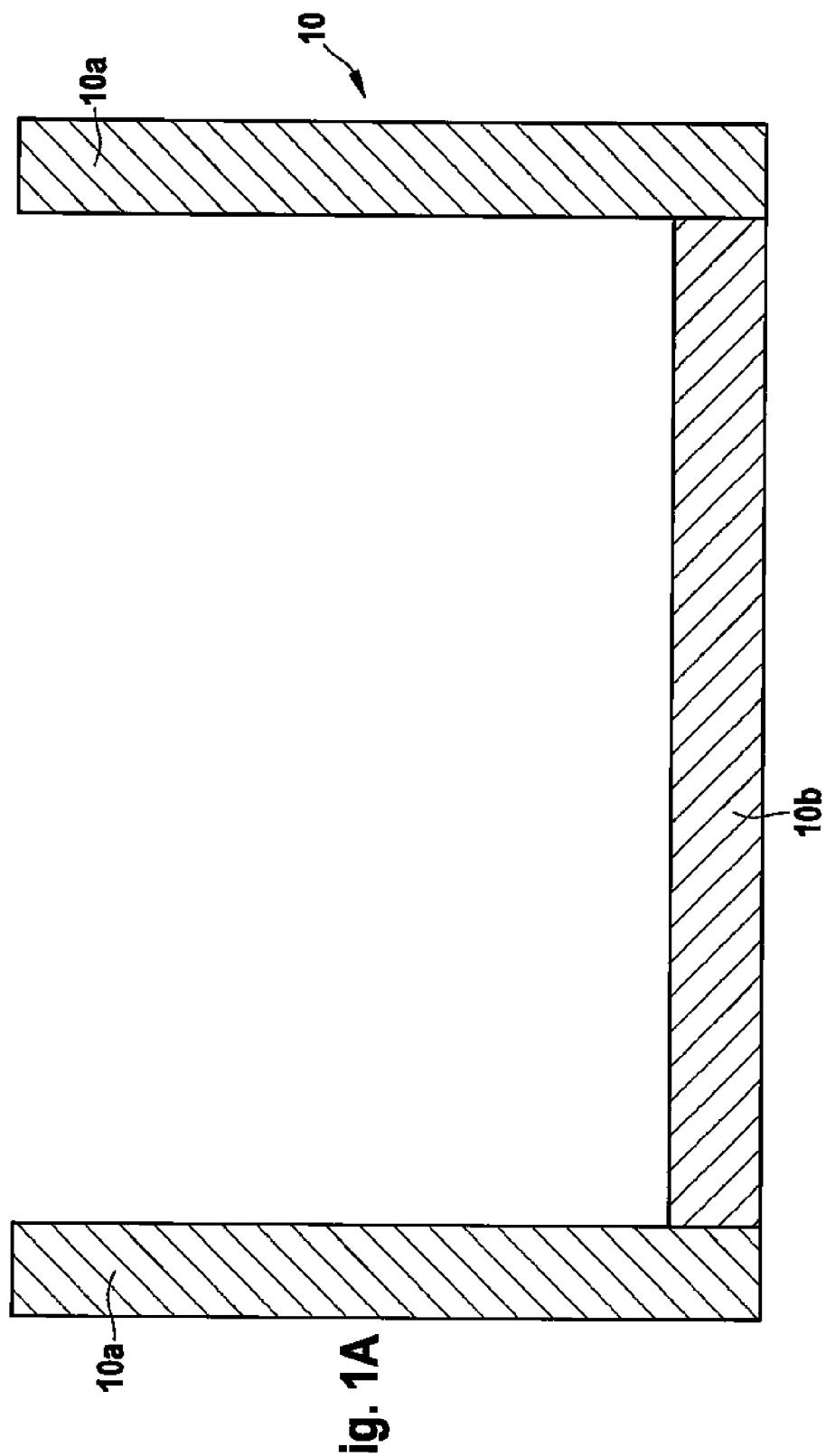

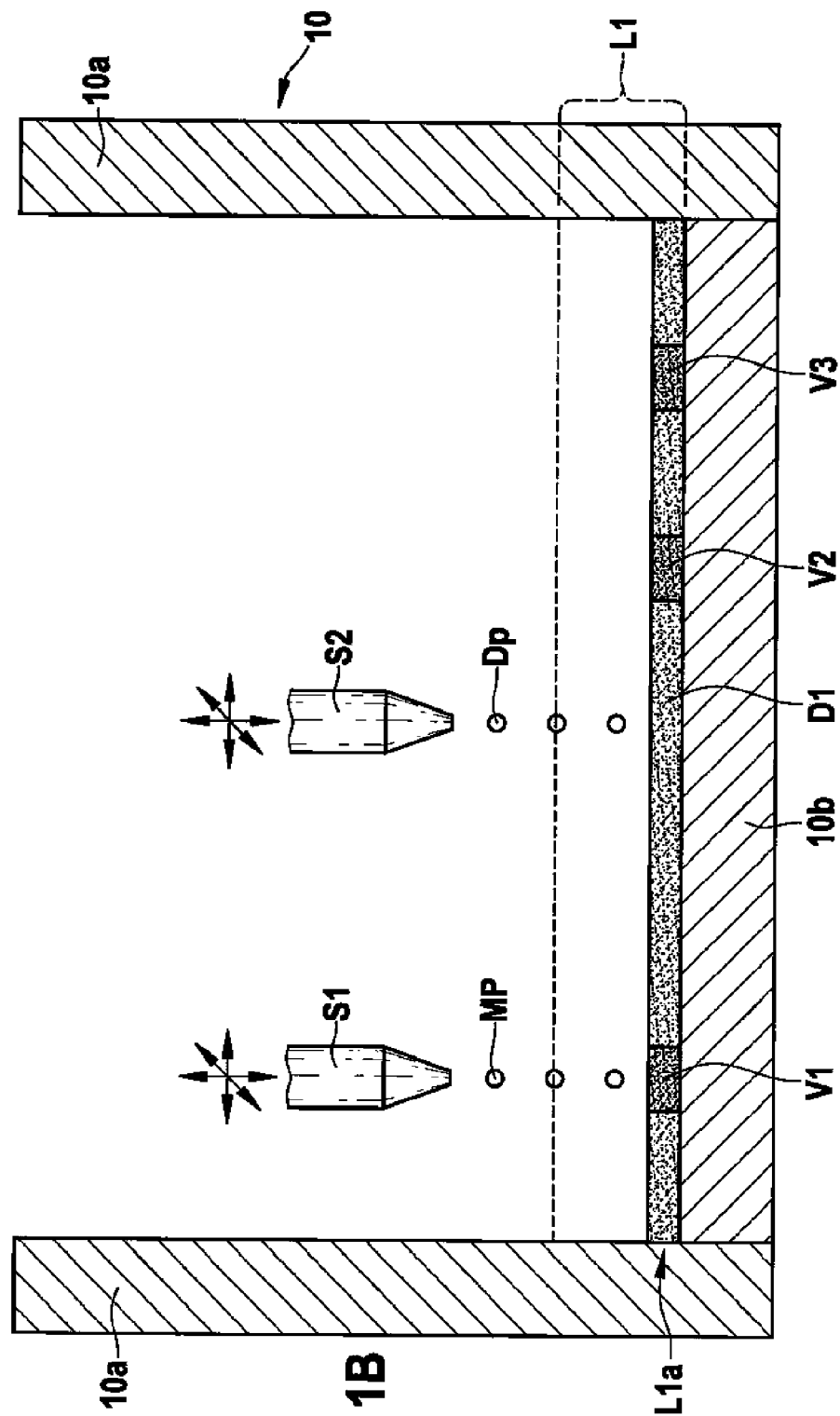

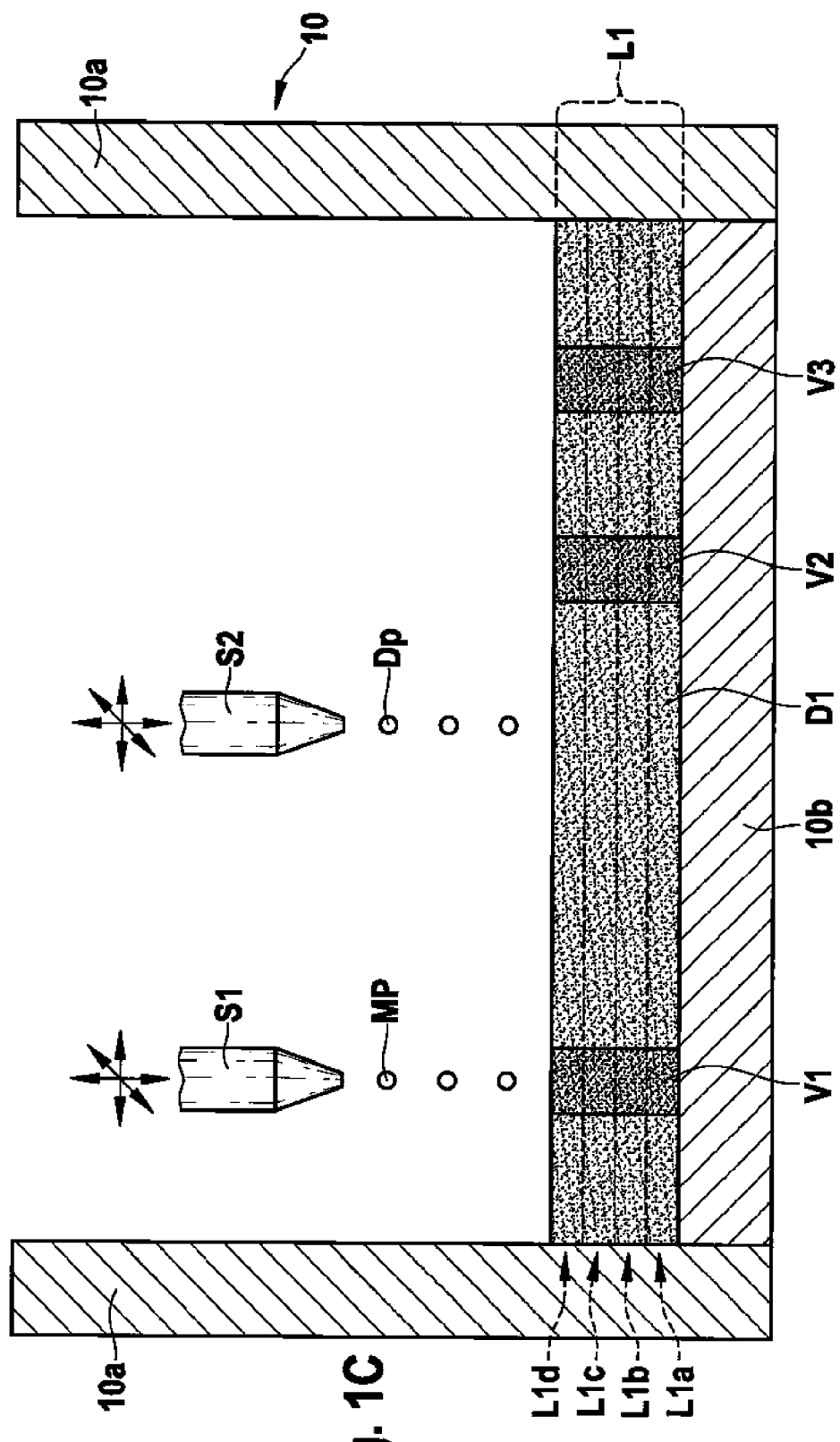

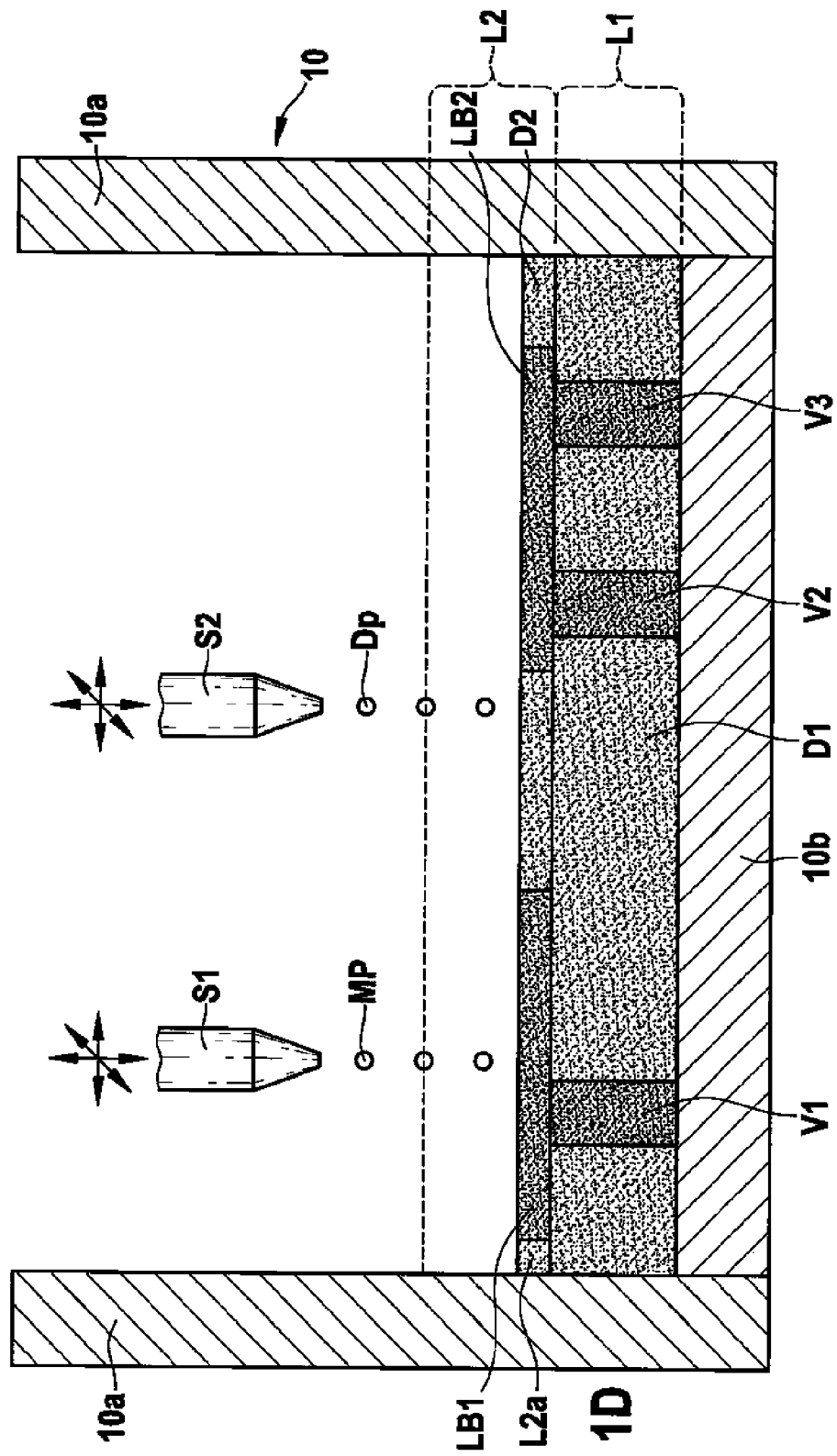

METHOD FOR THE PRODUCTION OF A CERAMIC MULTILAYER CIRCUIT ARRANGEMENT

FIELD OF INVENTION

The present invention relates to a method for producing a ceramic multilayer circuit system, and to a corresponding multilayer circuit system.

BACKGROUND INFORMATION

Ceramic wiring carriers having a multilayer construction can be produced using what is termed the LTCC (Low-Temperature Co-Fired Ceramic) method. A flexible tape or flexible film, made of a mixture of glass, ceramic, and organic solvents, is used as the initial base.

In a first step for the production of a LTCC wiring carrier, the films are cut for a corresponding number of layers. In a second step, the individual layers are mechanically processed, i.e., adjustment and through-connecting holes (vias) are stamped into the tape layers. In a third step, a via filling pressure is applied, and metallizations are applied by a screen printing process, using a suitable conductive paste. In a fourth step, the individual layers are pressed, and, in a fifth step, sintering takes place at approximately 850° C. to 900° C. During sintering, the LTCC material shrinks by approximately 15% in the z direction. Since about 1995, it has been possible to achieve a shrinkage of almost zero in the x/y direction. In further steps, resistances are applied on the rear side, and the printed conductors on the front side are provided with platinum layers.

Due to the possibility of processing the film layers before the sintering individually and in different ways, LTCC wiring carriers can be realized having many different shapes and constructions. LTCC wiring carriers are suitable, for example, for circuits exposed to high or low ambient temperatures and strong temperature change stress, because the LTCC can also be used as a construction element in the packaging. For example, in the automotive area, LTCC wiring carriers provide an economical and reliable solution for large piece counts. However, the organic materials, incorporated at first into the flexible films or into the printed conductor pastes via expensive intermediate stages for material preparation, are combusted, and thus do not create any value in the part.

Such methods for producing a ceramic multilayer circuit are described in German Patent Reference No. DE 196 15 787 A1 and German Patent Reference No. DE 198 17 359 A1. German Patent Reference No. DE 196 38 195 A1 discloses a dielectric paste for use in the production of ceramic multilayer circuits.

SUMMARY

Embodiments of the present invention provide a method and system for producing a ceramic multilayer circuit system or a corresponding multilayer circuit system.

Embodiments of the present invention, in comparison to the known LTCC methods, do without the expensive intermediate stages in the material processing, because the powders (e.g., metals, semimetals, metal oxides, dielectrics) can be processed directly using suitable processes.

Embodiments of a multilayer circuit system and method according to the present invention include being applied layer-by-layer through the deposition of powdered materials, by spraying via nozzles. For example, conductive materials (having different conductivities if warranted) and insulating materials are applied in powder form, in alternating fashion. The powders are brought into a pourable state, for example, using standard powder coating methods. After the various layers have been coated, the multilayer system is pressed in a tool, and is subsequently burned in a burning oven, yielding the finished multilayer circuit system.

In an embodiment, because the part production takes place in a single flow method with short processing times, an immediate conversion of the computer aided design or CAD data into hardware is possible through suitable data transfer and corresponding machine design. In an embodiment, due to the in situ construction, the number of layers is practically unlimited, and the shape of the substrate may be freely selected. In an embodiment, the accommodation of three-dimensional structures is possible through the coating. In an embodiment, an expensive driving out of organic components, as in the LTCC technique, is not necessary during the burning process, so that short burning profiles, e.g., 0.5-3 hours, may be used. For example, the coating of the powders can be achieved during the ramping up to the final burning temperature, by inserting a brief plateau phase in the temperature range 200-500° C. In embodiments of the present invention, the reduction of the processes that do not create value, in particular in material production, results in drastic cost advantages and a simplified process management. For example, in embodiments of the present invention, $Al_2O_3$ glass powder may be used as a ceramic powder, and silver powder may be used as a conductive powder.

In embodiments of the present invention, one may use stereolithography, using a laser, in order to enable a local adhesion of the powder during the application of very fine structures.

BRIEF DESCRIPTION OF THE DRAWINGS

Exemplary embodiments of the present invention are shown in the figures, and are explained in more detail in the following detailed description.

FIG. 1A shows a schematic cross-section for the illustration of a method for producing a ceramic multilayer circuit system according to a specific embodiment of the present invention.

FIG. 1B shows a schematic cross-section for the illustration of a method for producing a ceramic multilayer circuit system according to a specific embodiment of the present invention.

FIG. 1C shows a schematic cross-section for the illustration of a method for producing a ceramic multilayer circuit system according to a specific embodiment of the present invention.

FIG. 1D shows a schematic cross-section for the illustration of a method for producing a ceramic multilayer circuit system according to a specific embodiment of the present invention.

DETAILED DESCRIPTION

FIG. 1A-F show schematic cross-sections illustrating exemplary embodiments of a method and system for producing a ceramic multilayer circuit system.

In FIG. 1A, an embodiment of the present invention is shown having a laminating frame 10 with side walls 10a and a floor 10b. In an embodiment, in a subsequent coating process of the individual circuit layers, floor 10b acts as a substrate, and side walls 10a provide lateral limitation of the circuit layers.

In FIG. 1B, in an embodiment of the present invention, for the production of a first circuit layer L1, a first sub-circuit layer L1a is applied on floor 10b using a powder spray method. For example, in the powder spray method, a first spray head S1 is provided for spraying on a pourable metal powder MP, made of silver powder and provided with a coating, and a second spray head S2 is provided for spraying on a pourable ceramic powder DP, made of $Al_2O_3$ glass and provided with a coating. In an embodiment, spray heads S1, S2 are movable in order to enable a sequential separation of the structures. In an embodiment, the spraying on of the metal powder and of the ceramic powder can take place either simultaneously or in succession, depending on the consistency and the composition of the powders.

In an embodiment, typical particle sizes of the two powders are in the range of 1-5 μm. In an embodiment, a typical layer thickness of sub-circuit layer L1a is in the range of 10-50 μm.

In FIG. 1C, identical sub-circuit layers L1b, L1c, L1d are subsequently applied using the stated spray method, in order to complete first circuit layer L1. In an embodiment, the first circuit layer, as well as the respective sub-circuit layers L1a, L1b, L1c, L1d, have vias V1, V2, V3 made of the conductive metal powder and an insulating area D1 made of the ceramic powder.

In FIG. 1D, a sub-circuit layer L2a of a second circuit layer L2 is applied using the stated powder spray method. In an embodiment, this sub-circuit layer has printed conductor areas LB1, LB2 made of the metal powder and an insulating area D2 made of the ceramic powder.

Figure 1E:
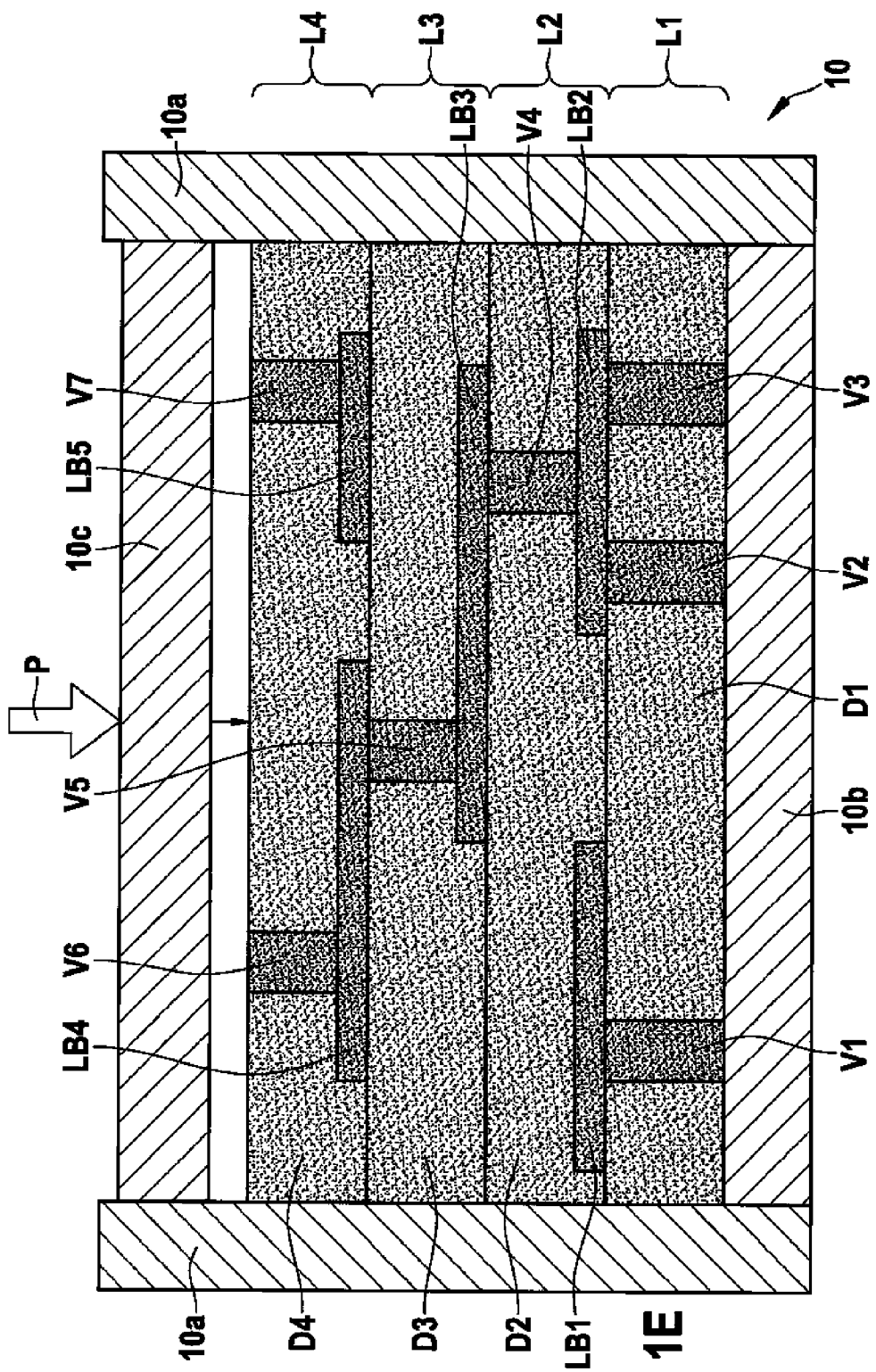
FIG. 1E shows a schematic cross-section for the illustration of a method for producing a ceramic multilayer circuit system according to a specific embodiment of the present invention.

In FIG. 1E, the finally coated multilayer circuit system according to the an embodiment has a total of four circuit layers L1, L2, L3, L4, a via V4 being placed on printed conductor area LB2 in the second circuit layer adjacent to printed conductor areas LB1, LB2. In an embodiment, in third circuit layer L3, a printed conductor area LB3 and a via V5 placed on it are provided that are surrounded by an insulating area D3. In an embodiment, in the fourth and topmost circuit layer L4, printed conductor areas LB4, LB5 are provided on which vias V6, V7 are applied, the insulating area of this fourth circuit layer L4 being designated with reference character D4. In an embodiment, after the completion of the coating of circuit layers L1-L4 using the stated powder spray method, a pressing takes place of coated circuit layers L1, L2, L3, L4, with the aid of a cover 10c of laminating frame 10 and a corresponding pressing device. In an embodiment, during the pressing, a pressure P is applied, for example, on the order of magnitude of 100 to several 100 $N/mm^2$.

Figure 1F:
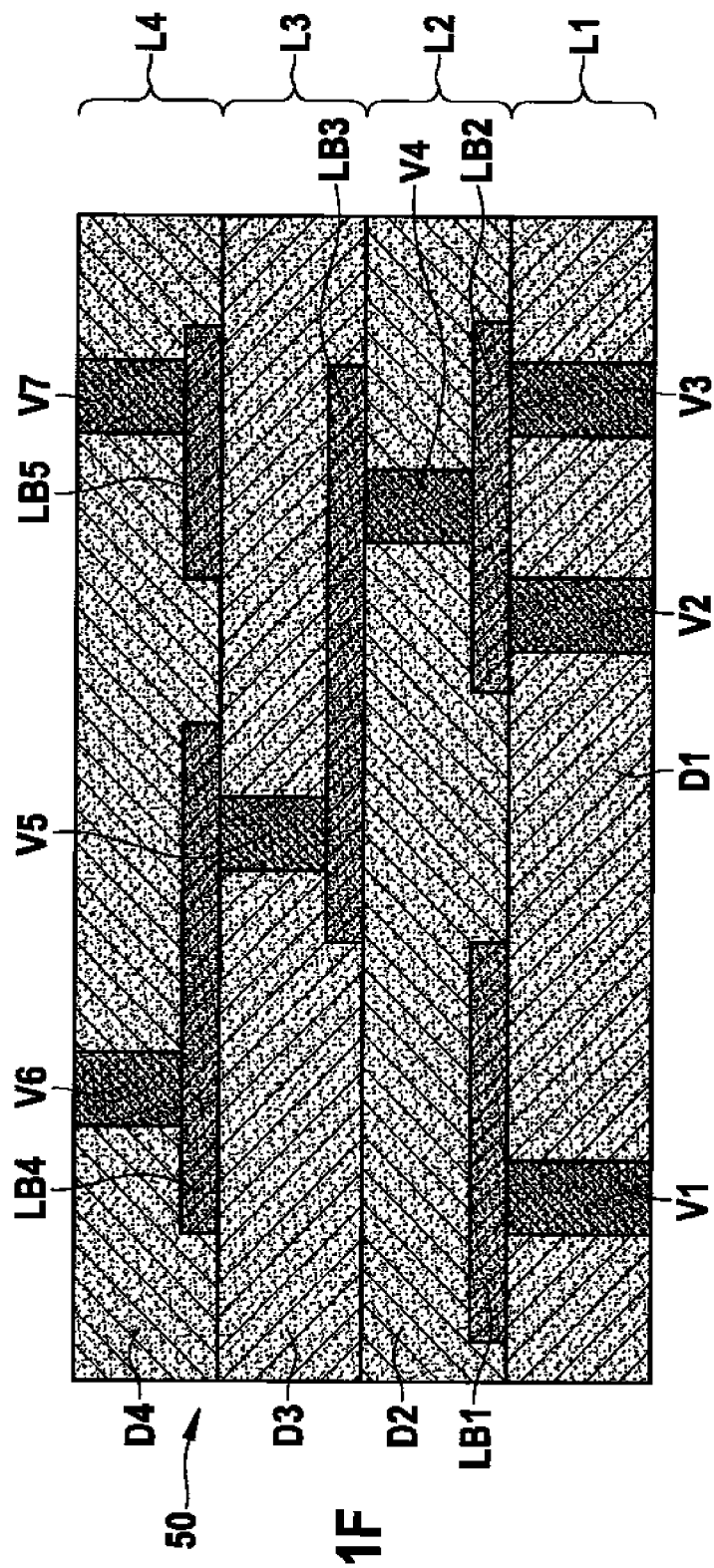
FIG. 1F shows a schematic cross-section for the illustration of a method for producing a ceramic multilayer circuit system according to a specific embodiment of the present invention.

In an embodiment, in a following process step, shown in FIG. 1F, a sintering process takes place in an oven in which first a brief plateau is traversed in the range 200-500° C. in order to burn out the coating of the powder. In an embodiment, after such, the temperature is raised to the final temperature, in the range 800-1000° C., e.g., 900° C., in order to produce the multilayer circuit system 50.

Although the present invention has been explained above on the basis of exemplary embodiments, the present invention is not limited thereto, and may also be realized in other ways.

Although in the above embodiments the individual circuit layers or sub-circuit layers all may have the same thickness, it also is possible to stack circuit layers or sub-circuit layers having different thicknesses in embodiments of the present invention.

In embodiments of the present invention, it is possible to spray on not just one conductive material and one insulating material in powder form in order to produce the circuit layers, but rather to spray on a plurality of powdered materials having different conductivities, in order, for example, to incorporate resistances or other passive components into the circuit system.

Embodiments of the present invention are not limited to the use of a laminating frame, but are also suitable for other substrates and pressing methods.

In embodiments of the present invention, the stated materials are not the only ones that may be used as ceramic powders and metal powders; rather, all powders suitable for spray processing may be used.

What is claimed is:

1. A method for producing a ceramic multilayer circuit system, comprising:
    sequentially depositing a plurality of circuit layers of the multilayer circuit system on a substrate in a powder spray method, the respective individual circuit layer of the plurality of circuit layers having both of electrically conductive areas made of at least one conductive powdered material and having electrically insulating areas made of at least one ceramic powdered material, wherein the plurality of circuit layers are sequentially deposited between side walls of a laminating frame;
    pressing the deposited plurality of circuit layers; and
    thermal sintering the pressed plurality of circuit layers.

2. The method as recited in claim 1, wherein the laminating frame is used for the pressing, and the substrate for the deposition is a floor of the laminating frame.

3. The method as recited in claim 1, wherein two movable spray heads are used during the powder spray method for the spraying on of the electrically conductive areas made of the conductive powdered material and the electrically insulating areas made of the ceramic powdered material.

4. The method as recited in claim 1, wherein the conductive material is a metal powder having a coating in order to ensure pourability, the coating being burned out during sintering in a temperature range between 200 and 500° C.

5. The method as recited in claim 1, wherein the ceramic material is a ceramic powder having a coating in order to ensure pourability, which is burned out during thermal sintering in a temperature range between 200 and 500° C.

6. The method as recited in claim 1, wherein the circuit layers have at least one circuit layer that is built up through deposition of a plurality of sub-circuit layers.

7. The method as recited in claim 6, wherein, for each of the at least one circuit layer, a relative arrangement of electrically conductive area to electrically insulating area is the same for all of the respective plurality of sub-circuit layers.

8. The method as recited in claim 6, wherein each of the plurality of sub-circuit layers has a thickness of 10 μm-50 μm.

9. The method as recited in claim 6, wherein different ones of the plurality of sub-layers are of different thicknesses.

10. The method as recited in claim 1, wherein the conductive powdered material and the ceramic powdered material include particle sizes in the range 0.1-5 micrometers.

11. The method as recited in claim 1, wherein the pressing is carried out at a pressure of one hundred to several hundred $N/mm^2$.

12. The method as recited in claim 1, wherein the thermal sintering is carried out at a temperature in a range of 800 to 1000° C.

13. The method as recited in claim 1, wherein the individual circuit layers are each produced with a thickness between 10 and 200 micrometers.

14. The method as recited in claim 1, wherein the thermal sintering is carried out at a temperature of about 900° C.

15. The method as recited in claim 1, wherein at least two of the respective individual circuit layers of the plurality of circuit layers have both of electrically conductive areas made of at least one conductive powdered material and having electrically insulating areas made of at least one ceramic powdered material.

16. The method as recited in claim 1, wherein each of the respective individual circuit layers of the plurality of circuit layers have both of electrically conductive areas made of at least one conductive powdered material and having electrically insulating areas made of at least one ceramic powdered material.

\* \* \* \* \*